(12) United States Patent
Park et al.

(10) Patent No.: US 7,871,921 B2
(45) Date of Patent: Jan. 18, 2011

(54) METHODS OF FORMING INTERCONNECTION STRUCTURES FOR SEMICONDUCTOR DEVICES

(75) Inventors: Jin-Taek Park, Gyeonggi-do (KR); Jong-Ho Park, Seoul (KR); Sung-Hoi Hur, Seoul (KR); Hyun-Suk Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 346 days.

(21) Appl. No.: 11/022,240

(22) Filed: Dec. 22, 2004

(65) Prior Publication Data

US 2005/0250307 A1    Nov. 10, 2005

(30) Foreign Application Priority Data

Jun. 25, 2004    (KR)  ..................... 10-2004-0048119

(51) Int. Cl.
*H01L 21/4763*    (2006.01)

(52) U.S. Cl. .................. 438/618; 438/629; 438/624; 438/626; 438/631; 257/315

(58) Field of Classification Search .................. 438/253
See application file for complete search history.

(56) References Cited

U.S. PATENT DOCUMENTS

| | | | |
|---|---|---|---|
| 6,020,255 A * | 2/2000 | Tsai et al. ................... | 438/618 |
| 6,083,824 A * | 7/2000 | Tsai et al. ................... | 438/629 |
| 6,258,649 B1 * | 7/2001 | Nakamura et al. .......... | 438/238 |
| 6,291,335 B1 * | 9/2001 | Schnabel et al. ............ | 438/626 |
| 6,342,416 B1 * | 1/2002 | Kim et al. ................... | 438/239 |
| 6,352,916 B1 * | 3/2002 | Tang et al. .................. | 438/622 |
| 6,399,438 B2 * | 6/2002 | Saito et al. .................. | 438/253 |
| 6,406,968 B1 * | 6/2002 | Chien et al. ................ | 438/381 |
| 6,461,911 B2 * | 10/2002 | Ahn et al. ................... | 438/253 |
| 6,479,341 B1 | 11/2002 | Lu | |
| 6,479,853 B2 | 11/2002 | Chishiki | |
| 6,576,509 B1 * | 6/2003 | Toyokawa et al. .......... | 438/253 |
| 6,677,230 B2 * | 1/2004 | Yokoyama et al. .......... | 438/620 |

(Continued)

FOREIGN PATENT DOCUMENTS

JP    11-054724    2/1999

(Continued)

OTHER PUBLICATIONS

Notice to File a Response/Amendment to the Examination Report for Korean Patent Application No. 10-2004-0048119 mailed on Feb. 21, 2006.

(Continued)

*Primary Examiner*—Steven Loke
*Assistant Examiner*—David Goodwin
(74) *Attorney, Agent, or Firm*—Myers Bigel Sibley & Sajovec, P.A.

(57) ABSTRACT

An interconnection structure for a semiconductor device includes an inter-level insulation layer disposed on a semiconductor substrate. First contact constructions penetrate the inter-level insulation layer. Second contact constructions penetrate the inter-level insulation layer. Metal interconnections connect the first contact constructions to the second contact constructions on the inter-level insulation layer. The first contact constructions include first and second plugs stacked in sequence and the second contact constructions include the second plug.

20 Claims, 22 Drawing Sheets

U.S. PATENT DOCUMENTS

| | | | |
|---|---|---|---|
| 6,716,764 B1 | 4/2004 | Girard et al. | |
| 6,734,065 B2 * | 5/2004 | Yim et al. | 438/257 |
| 6,780,707 B2 * | 8/2004 | Lee | 438/241 |
| 7,326,993 B2 * | 2/2008 | Kajimoto et al. | 257/315 |
| 2002/0149044 A1 * | 10/2002 | Nakanishi et al. | 257/296 |
| 2003/0087499 A1 | 5/2003 | Lane et al. | |
| 2005/0023600 A1 * | 2/2005 | Shin et al. | 257/315 |

FOREIGN PATENT DOCUMENTS

| | | |
|---|---|---|
| JP | 11-97534 | 4/1999 |
| JP | 2002-141412 | 5/2002 |
| KR | 10-2001-0298283 | 4/1999 |
| KR | 100292943 B1 | 3/2001 |
| KR | 10-2001-0075778 | 8/2001 |
| KR | 10-2002-0041190 A | 6/2002 |
| KR | 10-2003-0032650 | 4/2003 |
| KR | 10-2004-0076300 A | 9/2004 |
| KR | 10-0604920 B1 | 6/2006 |

OTHER PUBLICATIONS

"Translation of an Office Action issued by the German Patent and Trademark Office," issued Jan. 4, 2007.

* cited by examiner

METHODS OF FORMING INTERCONNECTION STRUCTURES FOR SEMICONDUCTOR DEVICES

RELATED APPLICATION

This application claims the benefit of and priority to Korean Patent Application No. 2004-0048119 filed Jun. 25, 2004, the disclosure of which is hereby incorporated herein by reference.

FIELD OF THE INVENTION

The present invention relates generally to integrated circuit devices and methods of forming the same and, more particularly, to interconnection structures for integrated circuit devices and methods of forming the same.

BACKGROUND OF THE INVENTION

Operating frequencies and integration densities are technical factors that may influence the cost of semiconductor devices. Device manufacturers are generally concerned with enhancing device performance and factors that affect the commercial value of the devices. As the operating frequency (or speed) is mostly affected by the resistance of interconnections connecting electrodes of transistors to each other in circuit patterns, it may be desirable to reduce the resistance of interconnections and to use techniques to improve operation and/or integration characteristics. Considering that the resistance of interconnections is dependent on the resistivity and sectional area of a material used for the interconnections, there has been proposed a technique for forming interconnections using a low-resistivity material, such as aluminum (Al) or copper (Cu). The Cu damascene process is a typical technique used to reduce interconnection resistance.

On the other hand, a shrink-down of pitches on conductive patterns, including interconnections, may be used to enhance the integration density of a semiconductor device. However, such a shrink-down in pitches of interconnections may cause the sheet resistance of the interconnections to increase. Such interconnections may use barrier metal layers to reduce the likelihood of an abnormal reaction and a diffusion of impurities.

FIG. 1 is a cross-section diagram that illustrates a conventional process for forming a semiconductor device that includes interconnection structures. In FIG. 1, a domain C1 depicts a partial section of a cell array region taken along a first direction, while a domain C2 depicts a vertical section of the domain C1 taken on a plane a.

Referring to FIG. 1, a field isolation layer 20 is formed in predetermined regions of a semiconductor substrate 10 to define active regions. The semiconductor substrate 10 may be divided into a cell array region and a peripheral region. After depositing a gate insulation layer 32 and a gate conductive layer 34 in sequence on the active regions, those layers 32 and 34 are patterned to form a gate pattern 30. From an ion implantation process with the gate pattern 30 as a mask, impurity regions 40 are provided in the active regions.

On the resultant structure where the impurity regions 40 are formed, an inter-level insulation layer 50 is deposited. The inter-level insulation layer 50 is patterned to form a first contact hole 55 partially opening the impurity regions of the cell array region. The impurity regions 50 exposed by the first contact hole 55 will be connected to a bitline formed by the subsequent process. After depositing a plug conductive layer on the inter-level insulation layer and filling the first contact hole 55, the plug conductive layer is etched away until the top surface of the inter-level insulation layer 50 is exposed. As a result, a contact plug 60 is formed that is connected to the impurity region 40 through the first contact hole 55. The contact plug 60 may be made of polycrystalline silicon.

A barrier metal layer 92 and a metal layer 94 are deposited on the inter-level insulation layer 50 in sequence. The metal layer 94 and the barrier metal layer 92 are patterned to form interconnecting constructions 90 connected to the contact plugs 60. During this, to prevent short circuits among the interconnecting constructions 90, the patterning process for the interconnecting constructions 90 is carried out with an over-etching technique. As a result of the over-etching, the inter-level insulation layer 50 around the interconnecting construction 90 becomes lower than the bottom of the barrier metal layer 92.

During the over-etching process, the contact plug 60 may not be etched anisotropically or removed faster than the inter-level insulation layer 50. As a result, as shown in FIG. 1, the top sides of the contact plug 60 may be etched away to result in a narrower section thereof, which causes the contact plug 60 not to be connected to the bitline 90 or to remain with high resistance.

In addition, the metal layer 94 is usually formed of aluminum, tungsten, or copper for high conductivity. But, when the metal layer 94 directly contacts the impurity regions 40 or the contact plug 60 that contains silicon, it may cause the degradation of quality due to impurity diffusion and abnormal reactions between the metal and the silicon. The barrier metal layer 92 is provided over a critical thickness $t_c$ to reduce the likelihood of such problems arising from contact between the metal and the silicon. However, the necessity for the critical thickness of the barrier metal layer 92 may reduce the ratio of an effective sectional area of the metal in the interconnecting construction 90, which may cause an abrupt increase of the sheet resistance in the interconnecting construction 90. Especially, if the minimum pitch of the interconnecting construction 90 is reduced to less than 0.1 μm, then the increase of the sheet resistance may be an important issue to address in fabricating high-frequency semiconductor devices.

SUMMARY OF THE INVENTION

According to some embodiments of the present invention, an interconnection structure for a semiconductor device includes an inter-level insulation layer disposed on a semiconductor substrate. First contact constructions penetrate the inter-level insulation layer. Second contact constructions penetrate the inter-level insulation layer. Metal interconnections connect the first contact constructions to the second contact constructions on the inter-level insulation layer. The first contact constructions include first and second plugs stacked in sequence and the second contact constructions include the second plug.

In other embodiments of the present invention, gate layers are interposed between the inter-level insulation layer and the semiconductor substrate, the gate layers being connected to the metal interconnections by the second contact constructions.

In still other embodiments of the present invention, the first plug comprises polycrystalline silicon. The second plug comprises a first barrier metal layer and a first metal layer, the first barrier metal layer comprising titanium, titanium-nitride, tungsten-nitride, tantalum, and/or tantalum-nitride, the first metal layer comprising tungsten, aluminum, and/or copper. The metal interconnections comprise a second barrier metal layer and a second metal layer, the second barrier metal layer comprising titanium, titanium-nitride, tungsten-nitride, tantalum, and/or tantalum-nitride, the second metal layer comprising tungsten, aluminum, and/or copper.

In still other embodiments of the present invention, the semiconductor substrate comprises a cell array region where cell transistors are arranged with cell impurity regions and cell gate layers, a low voltage region where low voltage transistors are arranged with low voltage impurity regions and low voltage gate layers, and a high voltage region where high voltage transistors are arranged with high voltage impurity regions and high voltage gate layers. The cell impurity regions are partially connected to the metal interconnections by the first contact constructions, and the cell gate layers, the low voltage gate layers, and the high voltage gate layers are connected to the metal interconnections by the second contact constructions.

In still other embodiments of the present invention, the low voltage impurity regions are connected to the metal interconnections by the first contact constructions and the high voltage impurity regions are connected to the metal interconnections by the second contact constructions.

In still other embodiments of the present invention, the high voltage impurity regions are connected to the metal interconnections by the first contact constructions and the low voltage impurity regions are connected to the metal interconnections by the second contact constructions.

In still other embodiments of the present invention, the high voltage and low voltage impurity regions are connected to the metal interconnections by the first contact constructions.

In still other embodiments of the present invention, the high voltage and low voltage impurity regions are connected to the metal interconnections by the second contact constructions.

In still other embodiments of the present invention, the cell gate layers comprise a floating gate electrode layer, a gate inter-level insulation layer, and a control gate layer, and the cell transistors and the metal interconnections form a cell array architecture of a NAND flash memory.

In further embodiments of the present invention, an interconnection structure for a semiconductor device includes a semiconductor substrate comprising a cell array region, a low voltage region, and a high voltage region. Cell transistors are disposed in the cell array region, which comprises cell impurity regions and cell gate layers. Low voltage transistors are disposed in the low voltage region, which comprises low voltage impurity regions and low voltage gate layers. High voltage transistors are disposed in the high voltage region, which comprises high voltage impurity regions and high voltage gate layers. Metal interconnections are disposed on the semiconductor substrate. First contact constructions connect the cell impurity regions to the metal interconnections. Second contact constructions connect the metal interconnections to the cell gate layers, the low voltage gate layers, and the high voltage gate layers. The first contact constructions comprise first and second plugs stacked in sequence and the second contact constructions comprise the second plugs.

In other embodiments of the present invention, an interconnection structure for a semiconductor device is formed by forming an inter-level insulation layer on a semiconductor substrate. First contact holes are formed that penetrate the inter-level insulation layer. First plugs are formed in the first contact holes. Second contact holes are formed that penetrate the inter-level insulation layer. Second plugs are formed that fill the first contact holes and the second contact holes. Metal interconnections are formed that are connected to the second plugs on the inter-level insulation layer.

In further embodiments of the present invention, an interconnection structure for a semiconductor device is formed by forming cell transistors in cell impurity regions and cell gate layers in a cell array region of a semiconductor substrate, low voltage transistors in low voltage impurity regions and low voltage gate layers in a low voltage region of the semiconductor substrate, and high voltage transistors in high voltage impurity regions and high voltage gate layers in a high voltage region of the semiconductor substrate. An inter-level insulation layer is formed on the resultant structure comprising the transistors. The inter-level insulation layer is patterned to form first contact holes partially exposing the cell impurity regions. First plugs are formed in the first contact holes. The inter-level insulation layer is patterned to form second contact holes partially exposing the cell gate layers, the low voltage gate layers, and the high voltage gate layers. Second plugs are formed to fill the second contact holes and the first contact holes. Interconnections are formed that are connected to the second plugs on the inter-level insulation layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
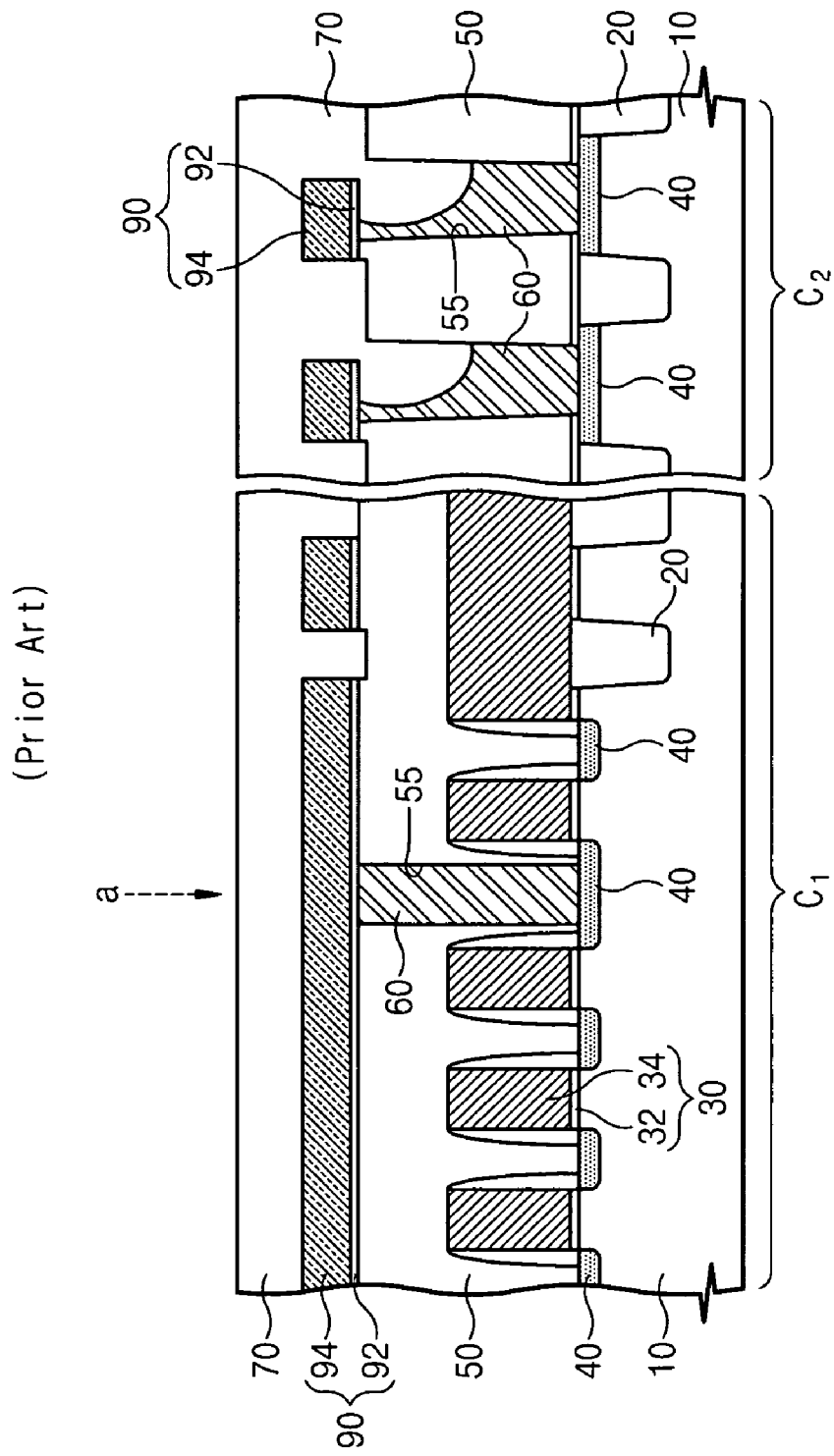
FIG. 1 is a cross-section diagram that illustrates a conventional process for forming a semiconductor device that includes interconnection structures.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A through 6B are cross-section diagrams that illustrate a processing flow for manufacturing a semiconductor device according to some embodiments of the present invention. FIGS. 7A and 7B are cross-section diagrams that illustrate a processing flow for manufacturing a semiconductor device according to further embodiments of the present invention. FIGS. 8 through 11, FIG. 12, FIGS. 13 through 15, and FIG. 16 are cross-section diagrams that illustrate processing flows for manufacturing a semiconductor device according to various other embodiments of the invention, respectively. In FIGS. 2A, 3A, 4A, 5A, 6A, and 7A, domains I, II, and III denote a common source region, a drain contact region, and a gate contact region, of a cell array region, respectively. In FIGS. 2B, 3B, 4B, 5B, 6B, and 7B, and in FIGS. 8 through 16, domains IV and V denote high and low voltage fields of a peripheral region, respectively.

Figure 2A:
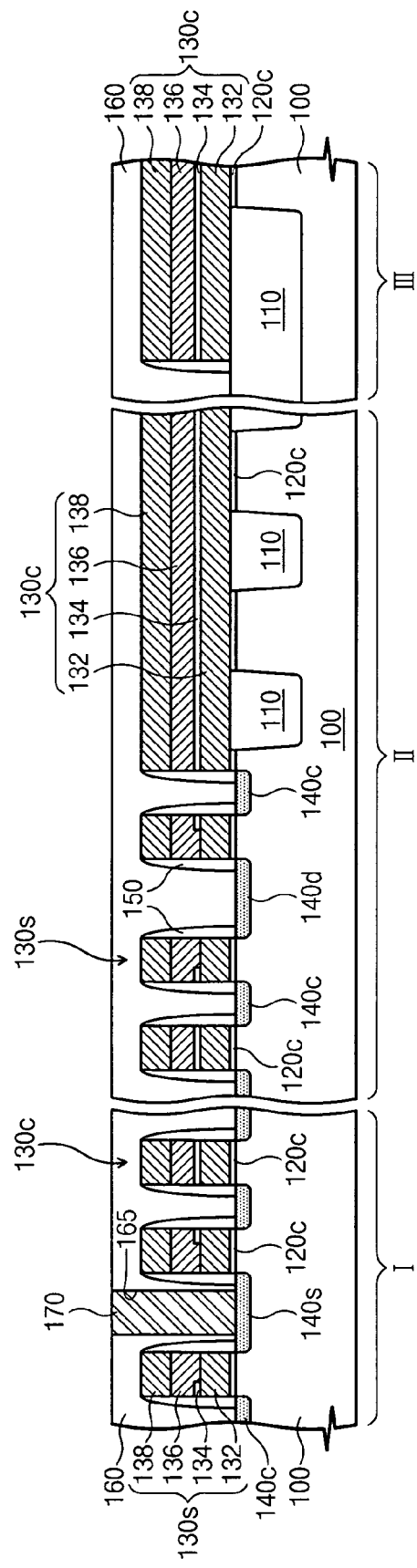
FIGS. 2A through 6B are cross-section diagrams that illustrate a processing flow for manufacturing a semiconductor device according to some embodiments of the present invention.
Figure 2B:
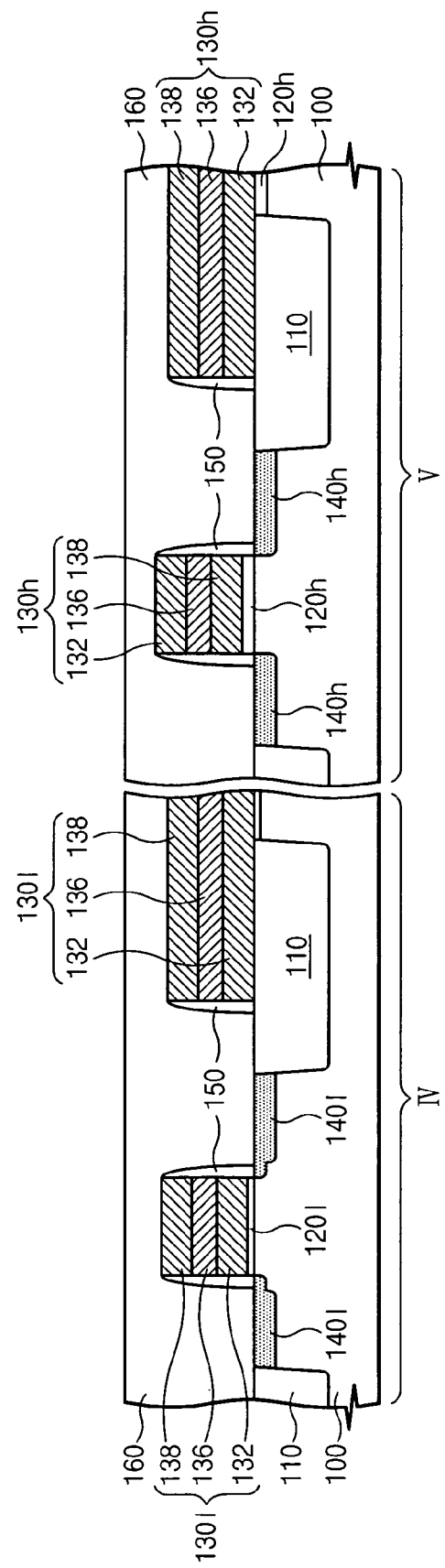

Referring to FIGS. 2A and 2B, after preparing a semiconductor substrate 100 comprising a cell array region and a peripheral region, a field isolation region 110 is formed to define active regions in predetermined positions in the semiconductor substrate 100. The cell array region comprises the common source region I, the drain contact region II, and the gate contact region III, while the peripheral region comprises the low voltage field IV and the high voltage field V. Subsequently, a gate insulation layer, a cell gate insulation layer 120c, a low-voltage (LV) gate insulation layer 120l, and a high-voltage (HV) gate insulation layer 120h are formed on the active regions of the cell array region, the low voltage field IV, and the high voltage field V, respectively. The HV gate insulation layer 120h may be thicker than the cell gate insulation layer 120c and the LV gate insulation layer 120l.

A gate patterning process forms cell gate layers 130c, LV gate layers 130l, and HV gate layers 130h that cross over the active regions and the field isolation layer 110 in the LV field IV and the HV field V. The cell gate layer 130c comprises a floating gate electrode layer 132, a gate inter-level insulation layer 134, and a control gate electrode layer (136, 138) that are stacked in sequence. The control gate electrode layer comprises a lower control gate electrode layer 136 and a higher control gate electrode layer 138. The floating gate electrode layer 132 and the lower control gate electrode layer 136 may comprise polycrystalline silicon, while the gate inter-level insulation layer 134 may comprise a compound of silicon, silicon-nitride, and silicon-oxide. The higher control gate electrode layer 138 comprises a low-resistance conductive material, such as tungsten-silicide or tungsten.

During formation of the cell gate layer 130c, the gate inter-level insulation layer 134 is removed in the LV and HV fields IV and V. Thus, the LV and HV gate layers, 130l and 130h, are each formed of the floating gate electrode layer 132, the lower control gate electrode layer 136, and the higher control gate layer 138. The gate inter-level insulation layer 134 may be partially removed at predetermined positions in the cell array region. As a result, in the predetermined positions of the cell array region, a selection gate layer 130s contacts the lower control gate electrode layer 136 directly with the floating gate electrode layer 132.

Next, an ion implantation process is carried out to form cell impurity regions 140c, LV impurity regions 140l, and HV impurity regions 140h in the active regions of the LV and HV fields IV and V. The cell impurity region 140c includes source impurity regions 140s and drain impurity regions 140d in the active regions between the patterns of the selection gate layers 130s. The ion implantation process may be carried out with a mask using the pattern of the gate layers 130 or the pattern of gate spacers 150 formed on both side walls of the gate layers 130. Therefore, the impurity regions 140 may have different positions with respect to each other in the cell array region.

On the resultant structure in which the impurity regions 140 are completed, a lower insulation layer 160 is deposited. The lower insulation layer 160 may comprise a silicon-oxide. The lower insulation layer 160 is patterned to form common source trenches 165 that expose the source impurity regions 140s. The common source trenches 165 are filled with a common source line layer 170 that connects the common source regions 140s. The common source line layer 170 may comprise tungsten.

Figure 3A:
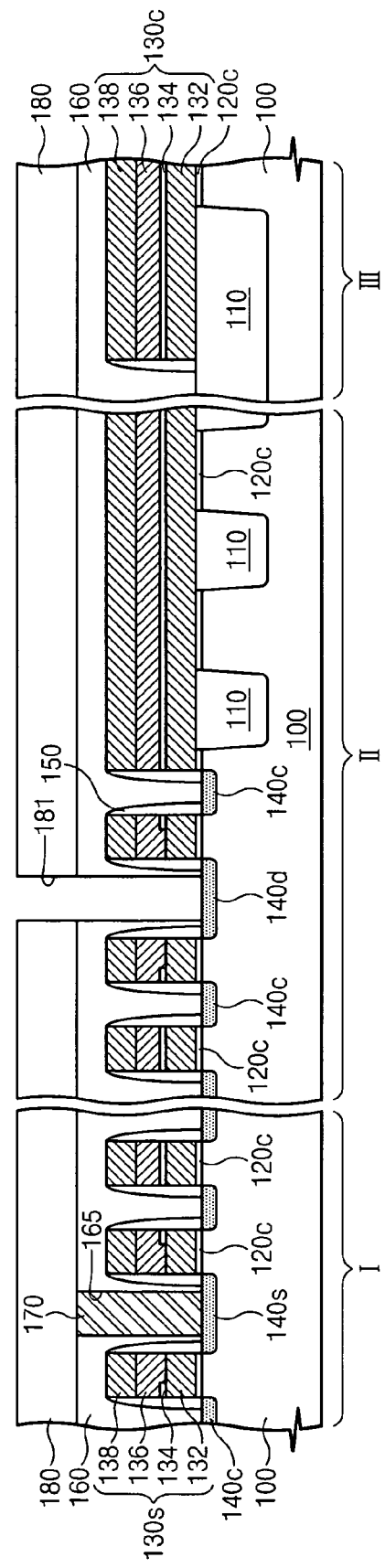
Figure 3B:
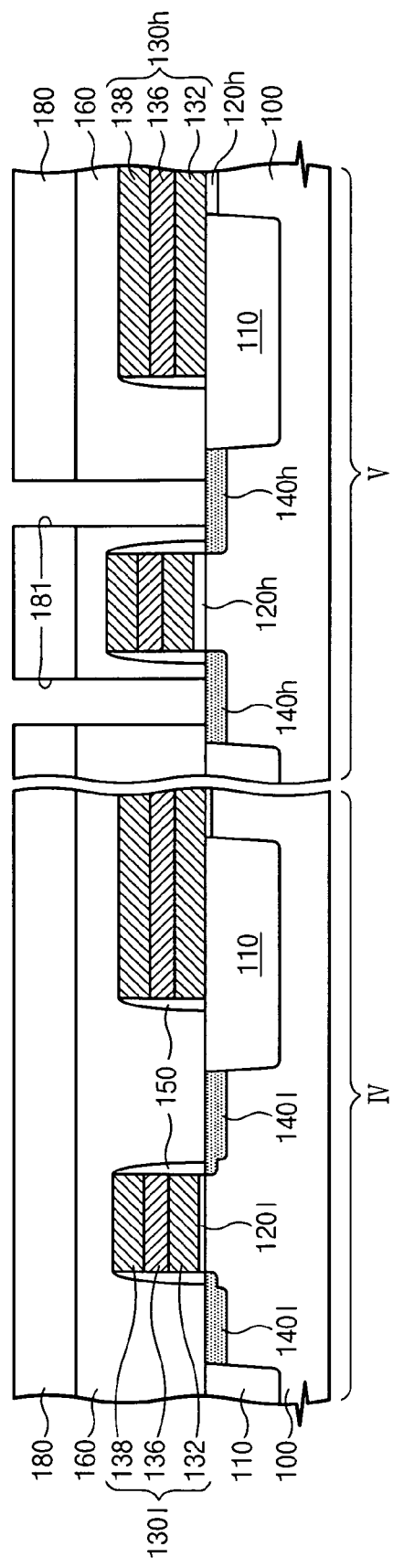

Referring to FIGS. 3A and 3B, a higher insulation layer 180 is formed in the resultant structure with the common source line layer 170. The higher and lower insulation layers, 180 and 160, constitute an inter-level insulation layer. The higher insulation layer 180 may comprise silicon-oxide, silicon-nitride, silicon-oxynitride, and/or porous insulation materials.

In some embodiments of the invention, the higher and lower insulation layers, 180 and 160, are sequentially patterned to form first contact holes 181 that expose the drain impurity regions 140d and the HV impurity regions 140h. The process for providing the first contact holes 181 may be implemented using an anisotropic etching technique incorporating an etch recipe having an etch selectivity against silicon. The lower insulation layer 160 may comprise silicon-nitride and silicon-oxide that are deposited in sequence, where the silicon-nitride is used as an etch stop layer for shaping the first contact holes 181.

Figure 8:
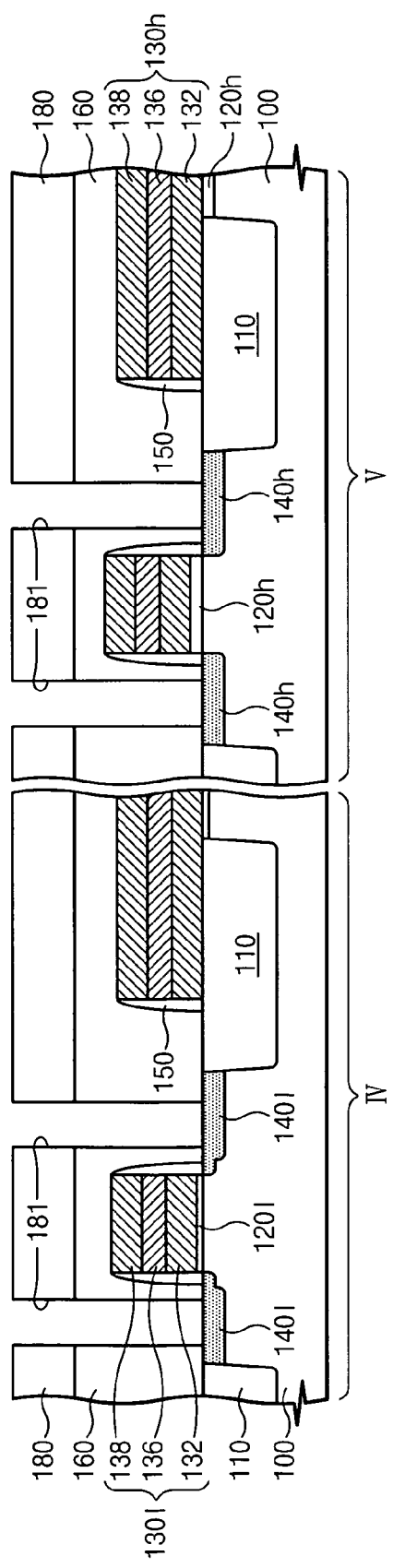
FIGS. 8 through 11, FIG. 12, FIGS. 13 through 15, and FIG. 16 are cross-section diagrams that illustrate processing flows for manufacturing a semiconductor device according to various other embodiments of the invention, respectively.
Figure 9:
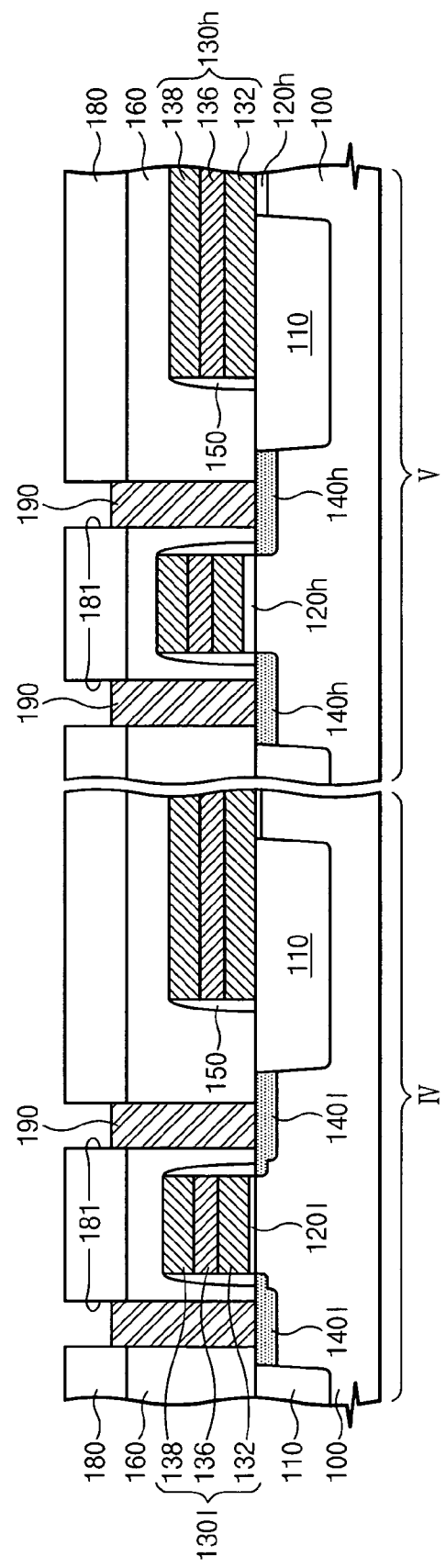
Figure 10:
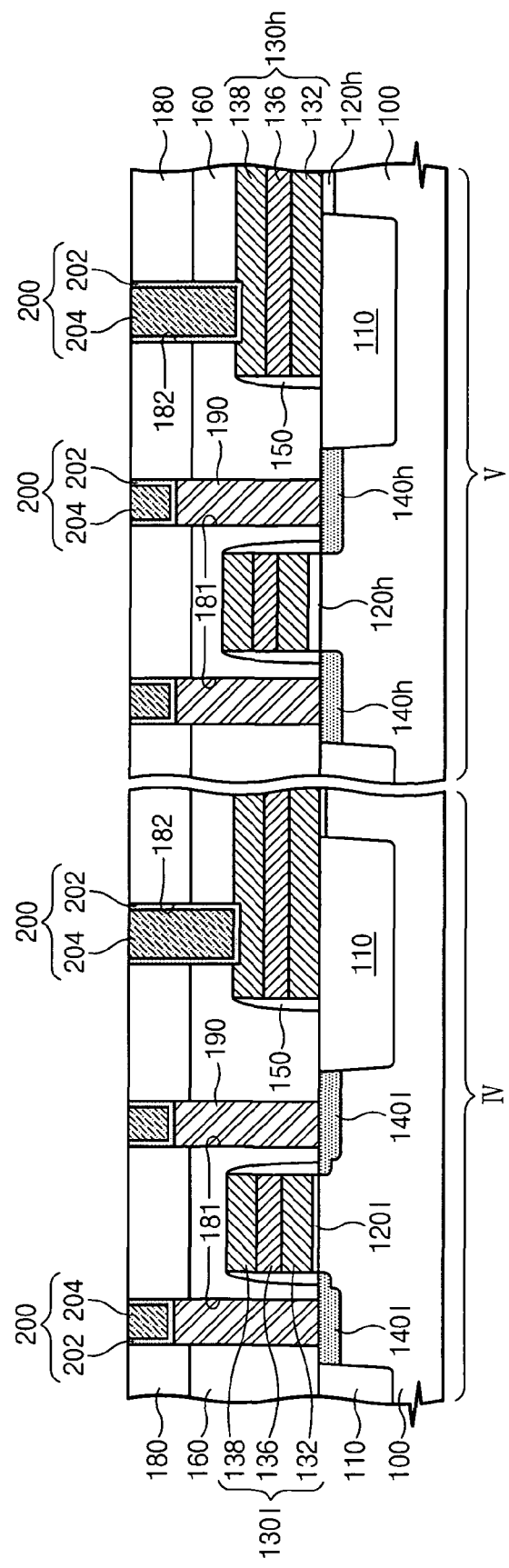
Figure 11:
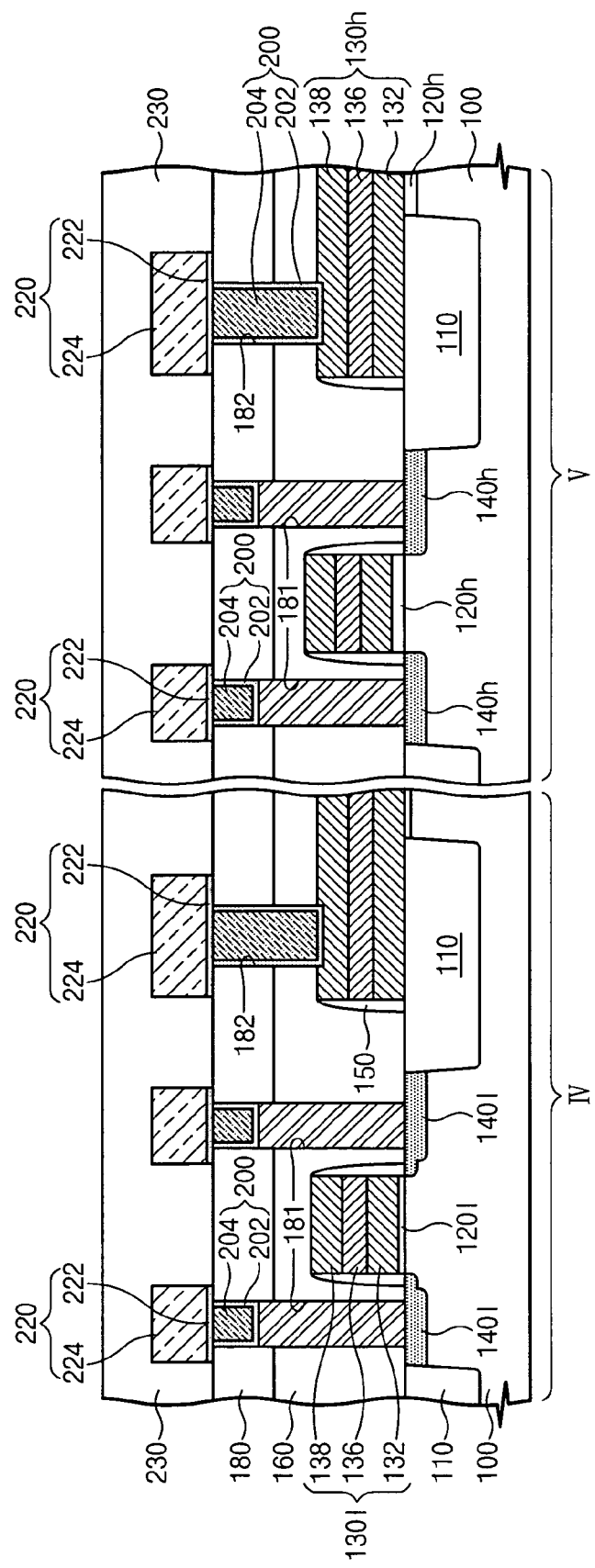
Figure 12:
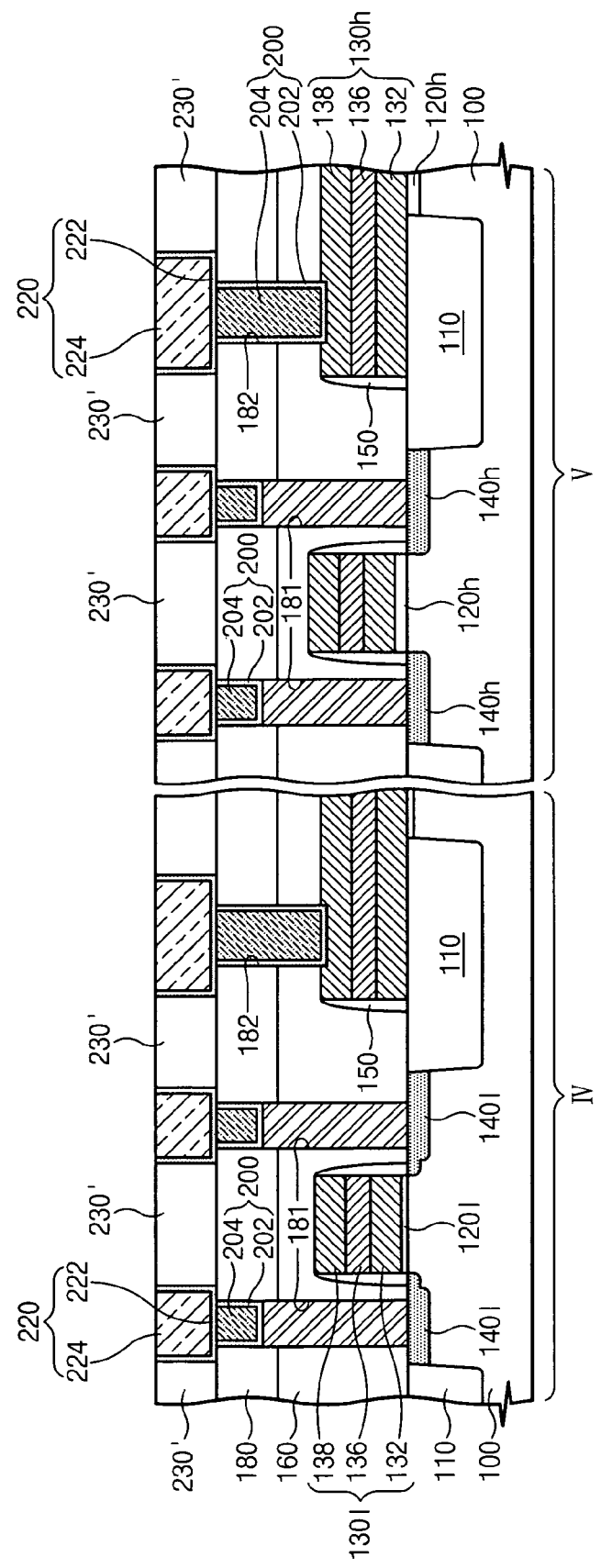
Figure 13:
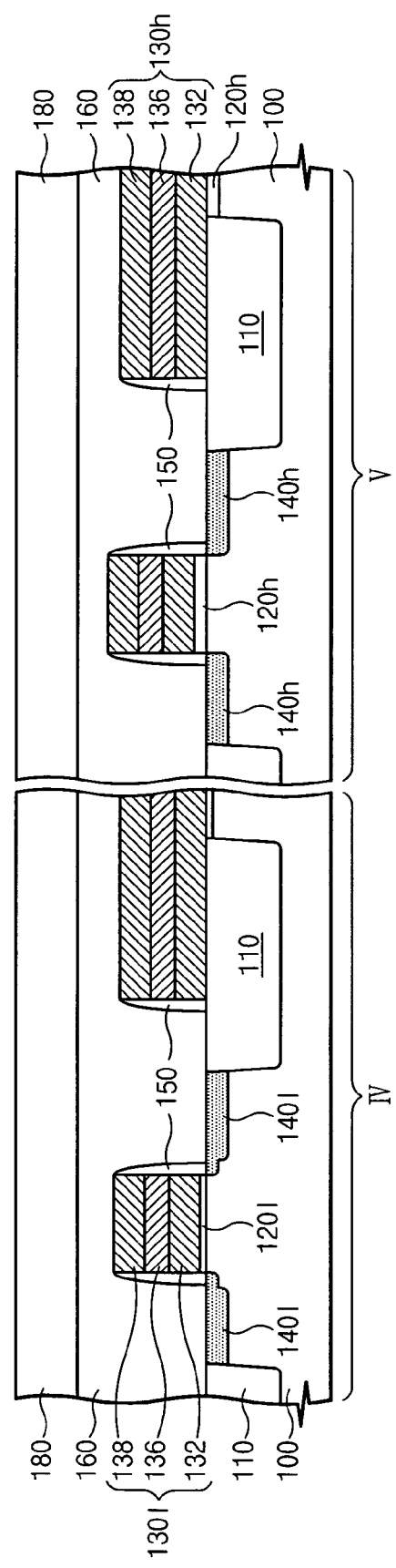
Figure 14:
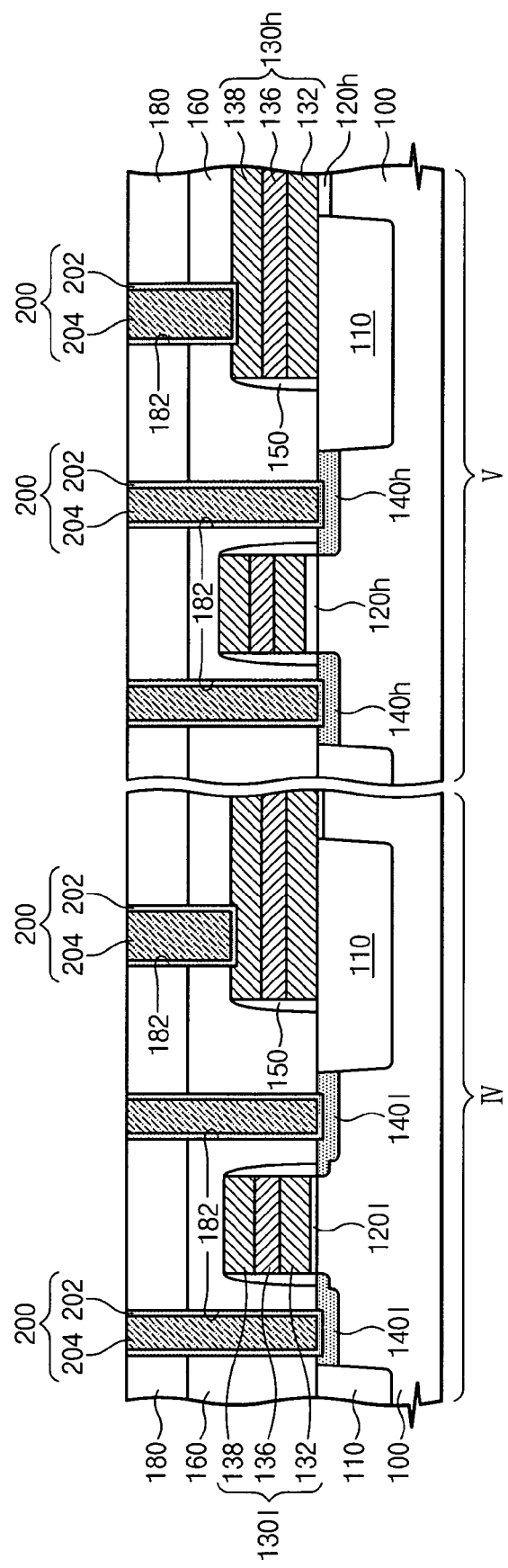
Figure 15:
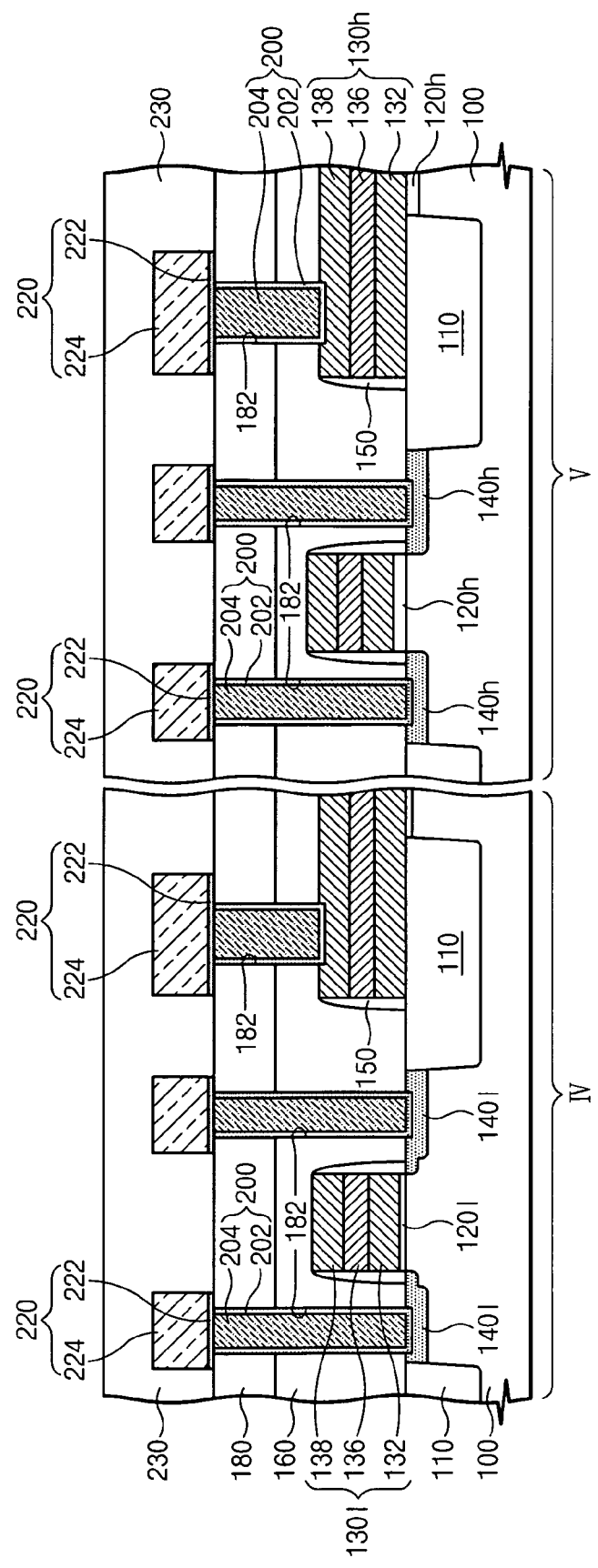
Figure 16:
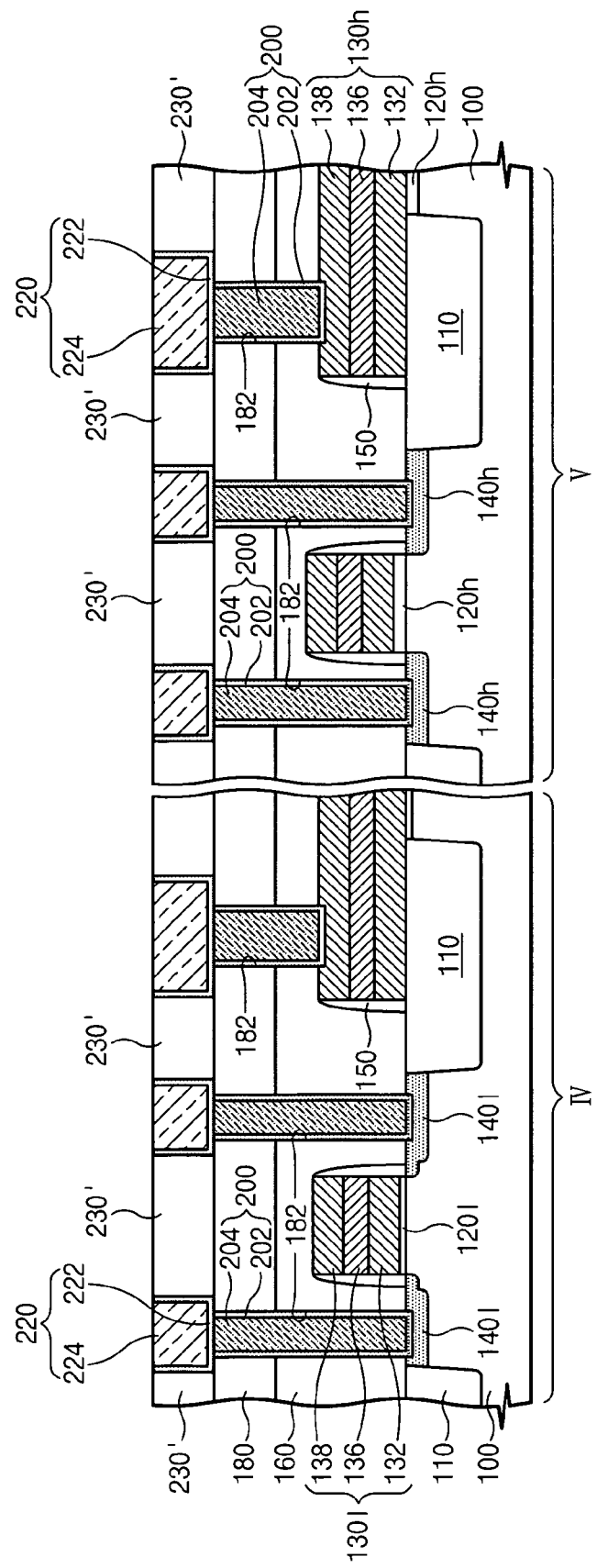

In other embodiments of the invention, the first contact holes 181 expose the drain impurity regions 140d, the HV impurity regions 140h, and the low voltage impurity regions 140l (refer to FIGS. 3A and 8).

In still other embodiments of the invention, the first contact holes 181 are confined within the cell array region. In other words, the first contact holes 181 expose only the drain impurity regions 140d, without being formed in the peripheral region (see FIGS. 3A and 13).

Figure 4A:
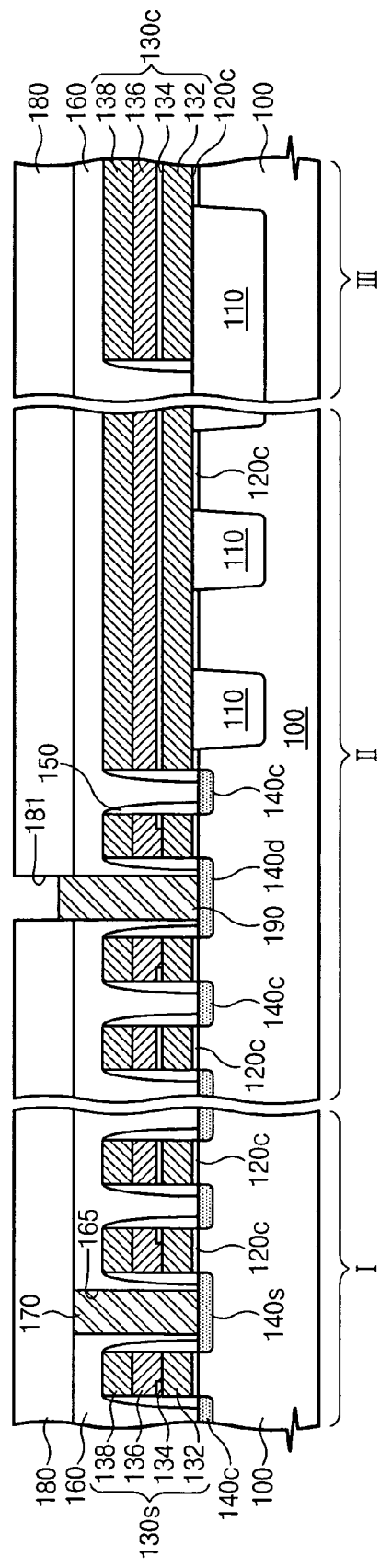
Figure 4B:
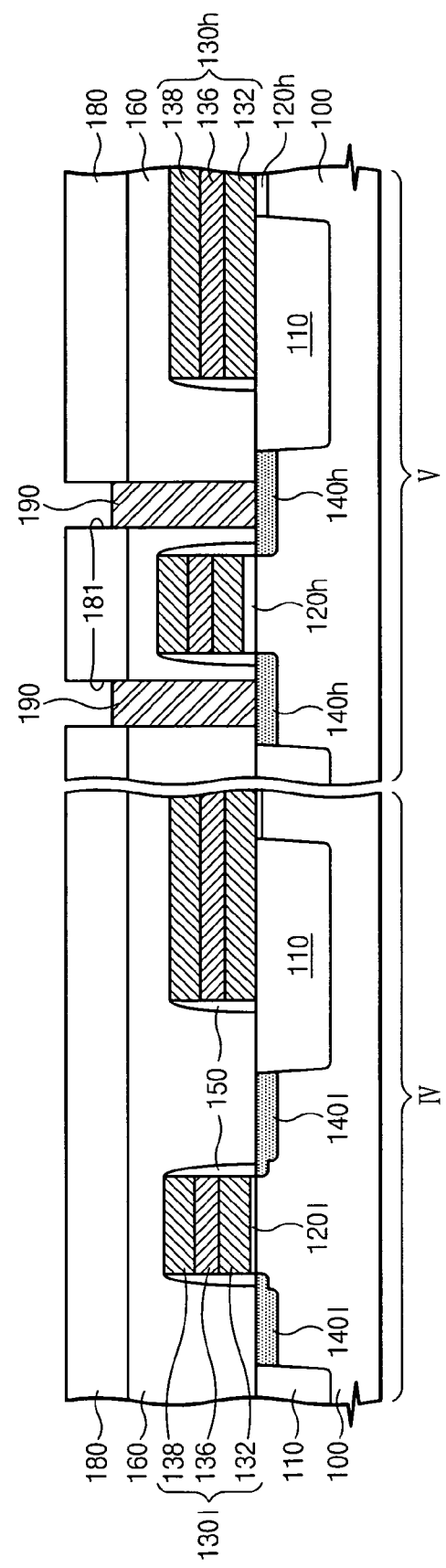

Referring to FIGS. 4A and 4B, a first conductive layer is deposited on the higher insulation layer 180 filling the first contact holes 181. The first conductive material may comprise polycrystalline silicon. The first conductive layer is then etched away to expose the top surface of the higher insulation layer 180. The first conductive layer may be etched by means of a chemical and mechanical polishing (CMP) process. As a result, the first contact holes 181 are filled with the first contact layer on the same level of the higher insulation layer 180. Next, the top surface of the first conductive layer is further etched away to be lower than that of the higher insulation layer 180. As a result, first plugs 190 fill the first contact holes 181 but are at a lower level than the higher insulation layer 180. The top surfaces of the first plugs 190 may be leveled higher than that of the lower insulation layer 160.

In some embodiments of the invention, the first plugs 190 are connected to the drain impurity regions 140d and the HV impurity regions 140h. In other embodiments of the invention, the first plugs 190 are connected to the drain impurity regions 140d, the HV impurity regions 140h, and the LV impurity regions 140l (see FIGS. 4A and 9). In still other embodiments of the invention, the first plugs 190 are connected only to the drain impurity regions 140d.

Figure 5A:
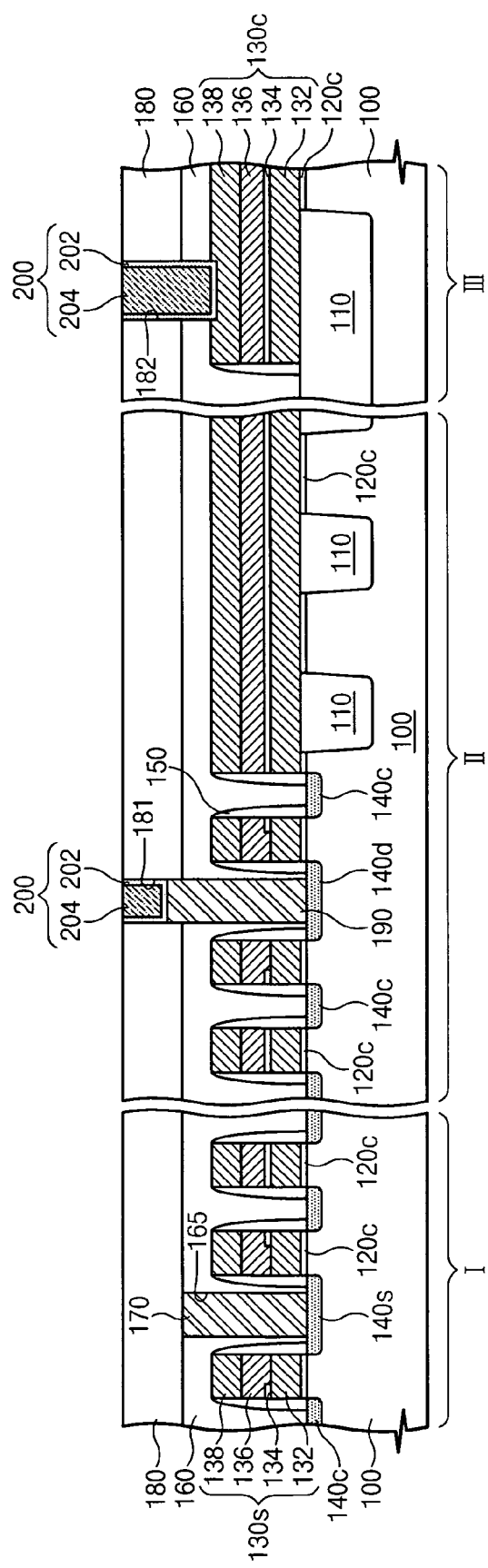
Figure 5B:
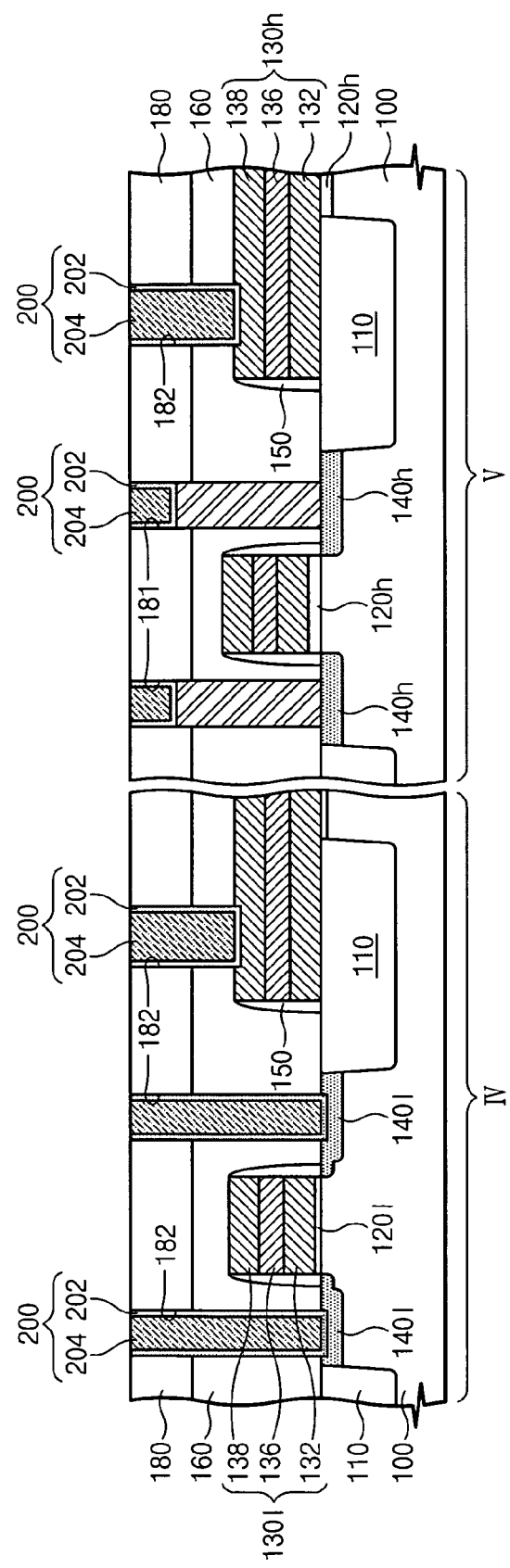

Referring to FIGS. 5A and 5B, the higher and lower insulation layers 180 and 160 are subsequently patterned to form second contact holes 182 partially exposing the top surfaces of the cell gate layers 130c, the LV gate layers 130l, and the HV gate layers 130h.

The process of forming the second contact holes 182 is carried out by anisotropically etching the higher and lower insulation layers, 180 and 160, in sequence with an etch mask pattern (not shown) laid on the higher insulation layer 180. The anisotropic etching process for the second contact holes 182 may include a first operation that includes an etch recipe capable of etching a silicon-oxide with the etch selectivity against silicon-nitride, and a second operation that involves the use of an etch recipe capable of etching a silicon-nitride with the etch selectivity against the higher control gate electrode layer 138. During this, the silicon-nitride forming the lower insulation layer 160 acts as an etch stop in the first operation of the anisotropic etching process for the second contact holes 182.

The etch mask pattern has openings that expose the higher insulation layer 180 over the cell gate layers 130c, the LV gate layers 130l, and the HV gate layers 130h. In some embodiments of the invention, the mask pattern exposes the top surface of the higher insulation layer 180 over the LV impurity regions 140l, which makes the second contact holes open over the top surfaces of the LV impurity regions 140l as shown in FIG. 5B. As discussed above, when the silicon-nitride of the lower insulation layer 160 acts as the etch stop layer, the process for shaping the second contact holes 182 may expose the LV impurity regions 140l while reducing the technical difficulty due to the difference of heights between the gate layer and the active region. The etching operation may be carried out by means of an etch recipe capable of removing the silicon-nitride with the etch selectivity against silicon.

A second conductive layer is deposited on the resultant structure in which the second contact holes 182 are settled. The second conductive layer fills up the tops of the first contact holes 181 as well as the second contact holes 182. The second conductive layer is then planarized by etching until the top of the higher insulation layer 180 is exposed, resulting in second plugs 200. The second plugs 200 fill up the tops of the first contact holes 181 as well as the second contact holes 182. As a result, the first contact holes 181 are filled with the first and second plugs, 190 and 200, deposited in sequence, while the second contact holes 182 are filled only with the second plugs 200.

According to some embodiments of the invention, the second conductive layer comprises a first barrier metal layer 202 and a first metal layer 204 that are stacked in sequence. The first barrier metal layer 202 comprises titanium (Ti), titanium-nitride (TiN), tungsten-nitride (WN), tantalum (Ta), and/or tantalum-nitride (TaN), while the first metal layer 204 comprises tungsten (W), aluminum (Al), and/or copper (Cu). The first barrier metal layer 202 may comprise layers of titanium and titanium-nitride deposited in sequence, and the first metal layer 204 may comprise tungsten. The first barrier metal layer 202 prevents the first metal layer 204 from directly contacting the first plugs 190.

In further embodiments of the invention, the second contact holes 182 do not expose the impurity regions 140l and 140h located in the peripheral region. According to these embodiments, the second plugs 200 are connected directly to the tops of the cell gate layers 130c, the LV gate layers 130l, and the HV gate layers 130h, and connected to the LV and HV impurity regions, 140l and 140h, through the first plugs 190 (see FIGS. 5A and 10). Normally, the second plugs 200 connected to the gate layers 130c, 130l, and 130h are disposed over the filed isolation layers 110.

In still further embodiments of the invention, the second contact holes 182 expose all of the impurity regions 140l and 140h in the peripheral region. According to these embodiments, the second plugs 200 are connected directly to the tops of the gate layers 130c, 130l, and 130h, the LV impurity region 140l, and the HV impurity region 140h (see FIGS. 14 and 10).

Figure 6A:
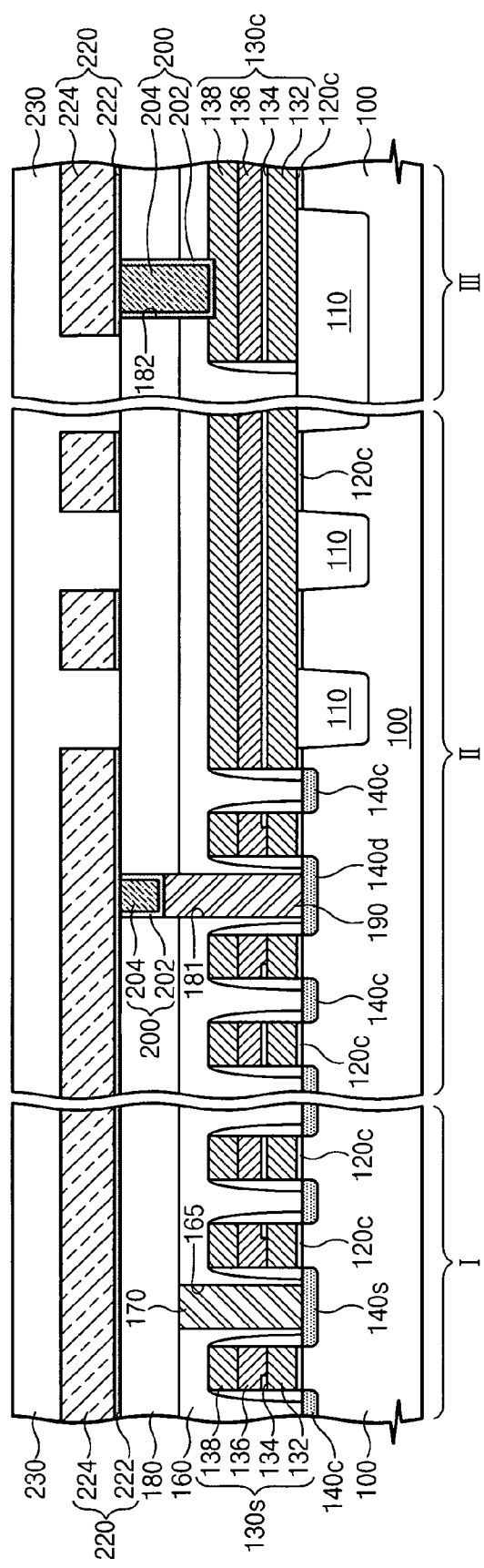
Figure 6B:
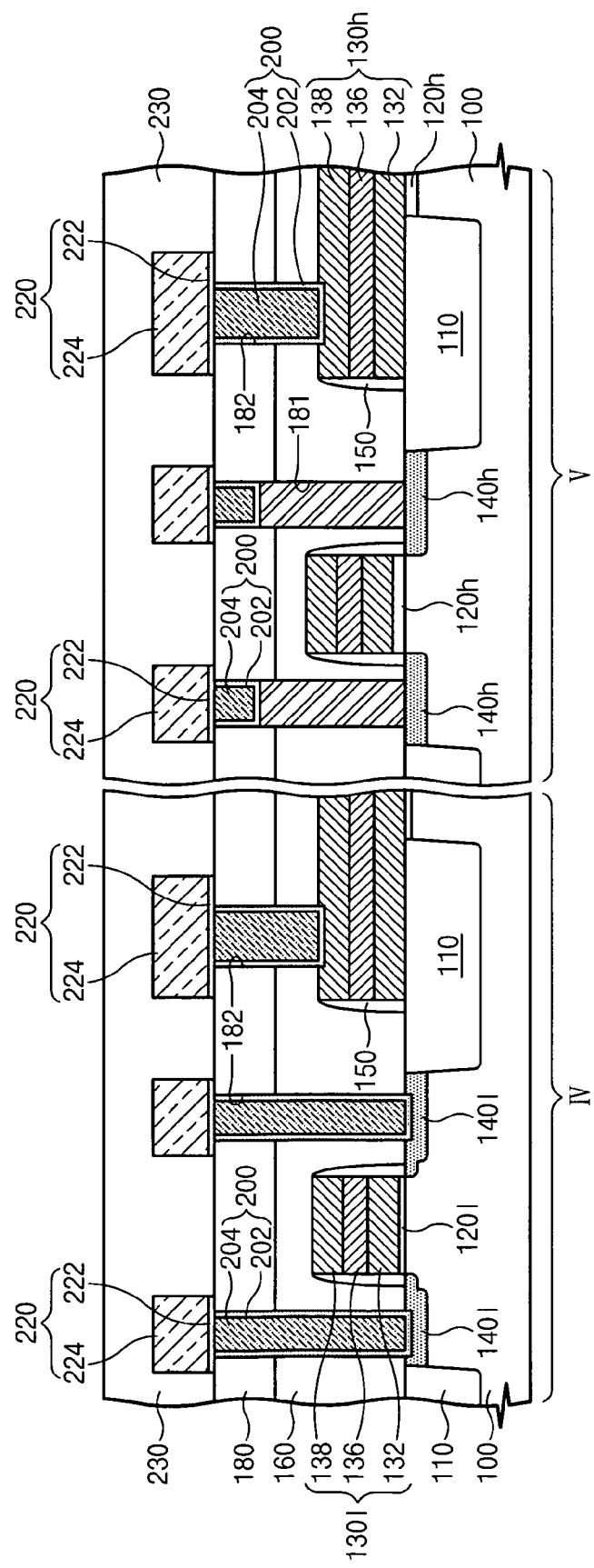
Figure 7A:
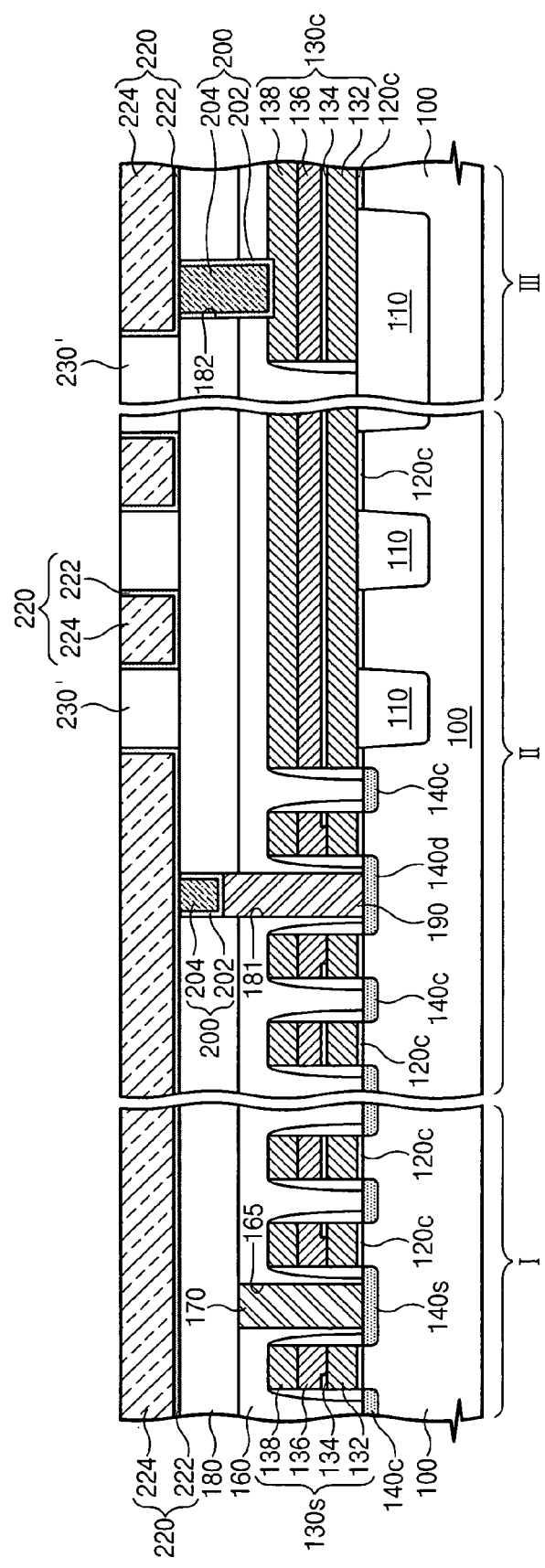
FIGS. 7A and 7B are cross-section diagrams that illustrate a processing flow for manufacturing a semiconductor device according to further embodiments of the present invention.
Figure 7B:
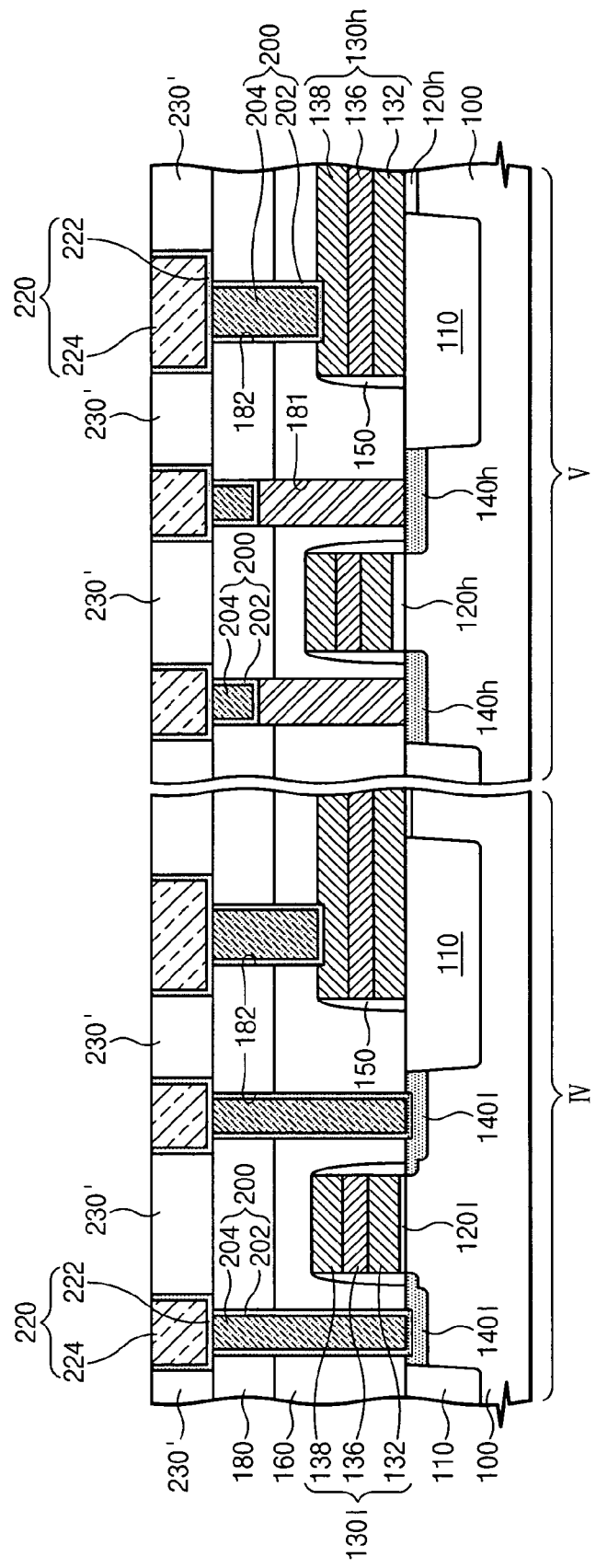

Referring to FIGS. 6A and 6B, on the resultant structure where the second plugs 200 are constructed, a third conductive layer is deposited and patterned to form metal interconnections 220 connected to the tops of the second plugs 200. An inter-metal insulation layer 230 is deposited on the structure having the metal interconnections 220.

The third conductive layer may comprise a second barrier metal layer 222 and a second metal layer 224 that are stacked in sequence. The second barrier metal layer 222 comprises titanium (Ti), titanium-nitride (TiN), tungsten-nitride (WN), tantalum (Ta), and/or tantalum-nitride (TaN), while the second metal layer 224 comprises tungsten (W), aluminum (Al), and/or copper (Cu). The second barrier metal layer 222 may comprise layers of titanium and titanium-nitride deposited in sequence, and the second metal layer 224 may comprise tungsten. The metal interconnections 220 may comprise the second metal layer 224 without the second barrier metal layer 220.

As a result, the metal interconnections 220 form bitlines that are each connected to the drain impurity regions 140d in the cell array region. The cell impurity regions 140c are each disposed between the drain impurity regions 140d connected to the bitlines and the source impurity regions 140s connected to the common source line layer 170. The patterns of the cell gate layers 130c are arranged between the cell impurity regions 140c. The selection gate layers 130s are disposed adjacent to the source impurity regions 140s and the drain impurity regions 140d.

The process of patterning the third conductive layer is carried out through anisotropic etching by means of an etch mask pattern that defines the metal interconnections 220 on the third conductive layer. Some embodiments of the invention include the process of forming the metal interconnections 220 with the patterning process (see FIGS. 6A, 6B, 11, and 15).

As stated above, the patterning process may also include an over-etching effect to prevent a short circuit between the adjacent interconnections. In the conventional case, the contact plug (60 of FIG. 1) results in a narrow section because the top sides are excessively over-etched. According to some embodiments of the invention, however, as the second plugs 200 of metal are disposed under the metal interconnections 220, the second plugs 200 are etched in an anisotropic etch mode while prosecuting the over-etch process for the metal interconnections 220. As result, problems with the conventional technique, e.g., the narrow section of the contact plug may be reduced and/or overcome.

In some embodiments of the invention, the metal interconnections 220 may be formed by means of a damascene process (refer to FIGS. 7A, 7B, 12, and 16). The damascene process is carried out by forming interconnection grooves 235 to expose the tops of the second plugs 200 after deposing and patterning a molding layer 230' on the structure having the second plugs 200. Afterwards, the third conductive layer is deposited thereon to fill the interconnection grooves 235 and is planarized by etching until the top of the molding layer 230' is exposed.

In the embodiments using such a damascene process, the third conductive layer may comprise the second barrier metal layer 222 and the second metal layer 224 that are stacked in sequence. However, according to some embodiments of the invention, because the second metal layer 224 indirectly contacts the first plugs 190, the thickness of the second metal layer 224 may be thinner than the critical thickness $t_c$ of the conventional case.

In addition, some embodiments of the present invention may not include the second barrier metal layer 222 if the second metal layer 224 is made of the same material as the first metal layer 204, or is not involved in the technical problems due to the impurities.

Returning to FIGS. 6A and 6B, the field isolation layer 110 is disposed at predetermined regions of the semiconductor substrate 100. The semiconductor substrate 100 comprises the cell array region and the peripheral regions. The cell array region comprises the common source region I, the drain contact region II, and the gate contact region IV, while the peripheral region comprises the LV region IV and the HV region V.

The cell gate insulation layer 120c, the LV gate insulation layer 120l, and the HV gate insulation layer 120h are formed on the LV and HV regions IV and V. The HV gate insulation layer 120h is usually thicker than the cell gate insulation layer 120c and the LV gate insulation layer 120i.

Further, in the cell array region, the LV region IV, and the HV region V, the patterns of the cell gate layers 130c, the LV gate layers 130l, and the HV gate layers 130h are arranged so as to cross the tops of the active regions and the field isolation layer 110.

The cell gate layer 130c comprises the floating gate electrode layer 132, the gate inter-level insulation layer 134, and the control gate electrode layer that are stacked in sequence. The control gate electrode layer comprises the lower and higher control gate electrode layers, 136 and 138, which are deposited in sequence. The floating gate electrode layer 132 and the lower control gate electrode layer 136 comprise polycrystalline silicon and the gate inter-level insulation layer 134 may comprise silicon-oxide, silicon-nitride, and/or silicon-oxide. The higher control gate electrode layer 138 comprises a low-resistance conductive material (e.g., tungsten-silicide or tungsten).

On the other hand, at predetermined places in the peripheral region, the gate inter-level insulation layer 134 is partially removed to form patterns of the selection gate layers 130s in which the lower control gate electrode layer 136 directly contacts the floating gate layer 132. The LV and HV gate layers, 130l and 130h, each comprise the floating gate electrode layer 132, the lower control gate electrode layer 136, and the higher control gate electrode layer 138.

The cell impurity regions 140c, the LV impurity regions 140l, and the HV impurity regions 140h are each disposed in the cell array region, the LV region IV, and the HV region V. The cell impurity regions 140c comprise the source and drain impurity regions, 140s and 140d, in the active regions between the patterns of the selection gate layers 130s. The impurity regions may be formed in different patterns in accordance with locations.

On the semiconductor substrate 100 having the impurity regions 140, an inter-level insulation layer 140 is formed that comprises lower and higher insulation layers 160 and 180. The lower insulation layer 160 comprises silicon-nitride and silicon-oxide stacked in sequence, while the higher insulation layer 180 comprises a silicon-oxide, a silicon-nitride, a silicon-oxynitride, and/or a porous insulation material. The lower insulation layer 160 comprises the common source line layer 170 connecting the source impurity regions 140s. The common source line layer 179 may comprise tungsten (W).

The metal interconnections 220 are laid on the higher insulation layer 180. A part of the metal interconnections 220 is connected to the drain impurity regions 140d by the first and second plugs 190 and 200 penetrating though the inter-level insulation layer. The first plug 190 may comprise polycrystalline silicon and the second plug may comprise the first barrier metal layer 202 and the first metal layer 204 stacked in sequence. According to some embodiments of the invention, the first barrier metal layer 202 comprises titanium (Ti), titanium-nitride (TiN), tungsten-nitride (WN), tantalum (Ta), and/or tantalum-nitride (TaN), while the first metal layer 204 comprises tungsten (W), aluminum (Al), and/or copper (Cu).

According to some embodiments of the invention, the cell gate layers 130c, the LV gate layers 130l, and the HV gate layers 130h are connected to the metal interconnections through the second plugs 200 without the first plugs 190. The drain impurity regions 140d are connected to the metal interconnections 220 through the first and second plugs 190 and 200.

The LV and HV impurity regions, 140l and 140h, may also be connected with the metal interconnections 220 in various features. In some embodiments of the invention, the HV impurity regions 140h are connected to the metal interconnections 220 through the first and second plugs, 190 and 200, which are stacked in sequence, while the LV impurity regions 140l are connected to the metal interconnections 220 through the second plugs 200 (see FIGS. 6A, 6B, 7A, and 7B).

In further embodiments of the invention, both the LV and HV impurity regions, 140l and 140h, are connected to the metal interconnections 220 through the first and second plugs, 190 and 200, which are stacked in sequence (see FIGS. 6A, 7A, 11, and 12). In still further embodiments of the invention, both the LV and HV impurity regions, 140l and 140h, are connected to the metal interconnections 220 just through the second plug 200 (see FIGS. 6A, 7A, 15, and 16).

Further, in other embodiments of the present invention, the metal interconnections 220 may comprise the second barrier metal layer 222 and the second metal layer 224 that are stacked in sequence. The second barrier metal layer 222 comprises titanium (Ti), titanium-nitride (TiN), tungsten-nitride (WN), tantalum (Ta), and/or tantalum-nitride (TaN), while the second metal layer 224 comprises tungsten (W), aluminum (Al), and/or copper (Cu). In these embodiments, the metal interconnections 220 are covered by the inter-metal insulation layer 230. According to some embodiments of the invention, the molding layer 230' is disposed between the metal interconnections 222, and the second barrier metal layer 222 is interposed between the molding layer 230' and the second metal layer 224. In addition, the metal interconnections 220 may be formed of the second metal layer 224 without the second barrier metal layer 222.

In the aforementioned embodiments, the cell impurity regions and the cell gate layers form cell transistors in the cell array region. The cell transistors may be arranged in the cell array region of a NAND flash memory device. The LV impurity regions and the LV gate layers form LV transistors in the LV region. The HV impurity regions and the HV gate layers form HV transistors in the HVI region. The LV and HV transistors may be arranged in the peripheral region including the LV and HV regions.

From the embodiments of the present invention described above, it can be seen that the metal interconnections directly contact the second plugs made of a metallic material, without contacting the first plugs. Therefore, the barrier metal layer may have a thickness less than the critical thickness or the metal interconnections may be formed without the barrier metal layer. As a result, some embodiments of the present invention may be useful for manufacturing a high-frequency semiconductor device because they inhibit increases in the sheet resistance of the metal interconnections.

In addition, even when the metal connections are shaped by patterning with an anisotropic etching process, the second plugs of metal can be etched together. Thus, the conventional problems, such as short circuits between plugs and interconnections or an increase of resistance therein, can be reduced. Because the manufacturing processes of the invention are applicable without additional photolithographic steps relative to the conventional methods, improved devices may be obtained without increasing costs.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of forming an interconnection structure for a semiconductor device, comprising:
    forming an inter-level insulation layer having a top surface on a semiconductor substrate;
    forming first contact holes to penetrate the inter-level insulation layer;
    forming first plugs in the first contact holes so as to expose the top surface of the inter-level insulation layer;
    forming second contact holes to penetrate the inter-level insulation layer;
    forming second plugs to fill the first contact holes and the second contact holes so as to expose the top surface of the inter-level insulation layer; and
    forming metal interconnections disposed directly on the top surface of the inter-level insulation layer to be connected to the second plugs;
    wherein a minimum pitch of the metal interconnections is less than about 0.1 μm.

2. The method as set forth in claim 1, further comprising:
    forming cell transistors having cell impurity regions and cell gate layers, and peripheral transistors having peripheral impurity regions and peripheral gate layers, in predetermined regions of the semiconductor substrate before forming the inter-level insulation layer;
    wherein forming the first contact holes comprises partially exposing the cell impurity regions and forming the second contact holes comprises partially exposing the cell and peripheral gate layers.

3. The method as set forth in claim 2, wherein forming the first contact holes comprises partially exposing the peripheral impurity regions.

4. The method as set forth in claim 2, wherein forming the second contact holes comprises partially exposing the peripheral impurity regions.

5. The method as set forth in claim 1, wherein forming the first plugs comprises:
    forming a first conductive layer to fill the first contact holes on the inter-level insulation layer;
    etching the first conductive layer until the top of the inter-level insulation layer is exposed; and
    recessing the first conductive layer to be lower than the top of the inter-level insulation layer.

6. The method as set forth in claim 1, wherein forming the second plugs comprises:
    forming a second conductive layer to fill the second contact holes and the first contact holes where the first plugs are disposed, on the inter-level insulation layer; and
    etching the second conductive layer until the top of the inter-level insulation layer is exposed;

wherein the second conductive layer comprises a first barrier metal layer and a first metal layer, which are stacked in sequence.

7. The method as set forth in claim 1, wherein the first plugs comprise a conductive material different from the second plugs and the metal interconnections, the first plug comprising polycrystalline silicon; wherein the second plug comprises a first barrier metal layer and a first metal layer, the first barrier metal layer comprising titanium, titanium-nitride, tungsten-nitride, tantalum, or tantalum-nitride, the first metal layer comprising tungsten, aluminum, or copper; and wherein the metal interconnections comprises a second barrier metal layer and a second metal layer, the second barrier metal layer comprising titanium, titanium-nitride, tungsten-nitride, tantalum, or tantalum-nitride, the second metal layer comprising tungsten, aluminum, or copper.

8. The method as set forth in claim 1, wherein forming the metal interconnections comprises:
forming a conductive layer on the inter-level insulation layer; and
patterning the conductive layer so that the metal interconnections cross tops of the first and second contact holes.

9. The method as set forth in claim 1, wherein forming the metal interconnections comprises:
forming a molding layer on the inter-level insulation layer;
patterning the molding layer to form interconnection grooves exposing tops of the second plugs;
forming a conductive layer to fill the interconnection grooves on the molding layer; and
etching the conductive layer until the top of the molding layer is exposed.

10. The method as set forth in claim 2, wherein forming the cell and peripheral transistors comprises forming the cell transistors in the cell impurity regions and the cell gate layers in a cell array region of the semiconductor substrate, low voltage transistors in low voltage impurity regions and low voltage gate layers in a low voltage region of the semiconductor substrate, and high voltage transistors in high voltage impurity regions and high voltage gate layers in a high voltage region of the semiconductor substrate.

11. The method as set forth in claim 10, wherein forming the cell transistors comprises forming the cell gate layer having a floating gate electrode layer, a gate inter-level insulation layer, and a control gate electrode layer which are stacked in sequence.

12. The method as set forth in claim 10, wherein faulting the first contact holes comprises further exposing the low voltage impurity regions and forming the second contact holes comprises further exposing the high voltage impurity regions.

13. The method as set forth in claim 10, wherein forming the first contact holes comprises further exposing the high voltage impurity regions and forming the second contact holes comprises further exposing the low voltage impurity regions.

14. The method as set forth in claim 10, wherein forming the first contact holes comprises further exposing the low and high voltage impurity regions.

15. The method as set forth in claim 10, wherein farming the second contact holes comprises further exposing the low and high voltage impurity regions.

16. The method as set forth in claim 10, wherein the cell transistors and the metal interconnections comprise a cell array architecture of a NAND flash memory.

17. A method of forming an interconnection structure for a semiconductor device, comprising:
forming cell transistors in cell impurity regions and cell gate layers in a cell array region of a semiconductor substrate, low voltage transistors in low voltage impurity regions and low voltage gate layers in a low voltage region of the semiconductor substrate, and high voltage transistors in high voltage impurity regions and high voltage gate layers in a high voltage region of the semiconductor substrate;
forming an inter-level insulation layer having a top surface on the resultant structure comprising the transistors;
patterning the inter-level insulation layer to form first contact holes partially exposing the cell impurity regions;
forming first plugs in the first contact holes so as to expose the top surface of the inter-level insulation layer;
patterning the inter-level insulation layer to form second contact holes partially exposing the cell gate layers, the low voltage gate layers, and the high voltage gate layers;
forming second plugs to fill the second contact holes and the first contact holes so as to expose the top surface of the inter-level insulation layer; and
forming interconnections disposed directly on the top surface of the inter-level insulation layer to be connected to the second plugs;
wherein a minimum pitch of the interconnections is less than about 0.1 µm.

18. The method as set forth in claim 17, wherein forming the first contact holes comprises further exposing the low and/or high voltage impurity regions and forming the second contact holes comprises further exposing the low and/or high voltage impurity regions.

19. The method as set forth in claim 17, wherein the first and second plugs comprise a conductive material different from the interconnections, the first plug comprising polycrystalline silicon; wherein the second plug comprises a first barrier metal layer and a first metal layer, the first barrier metal layer comprising titanium, titanium-nitride, tungsten-nitride, tantalum, or tantalum-nitride, the first metal layer comprising tungsten, aluminum, or copper; and wherein the interconnections comprise a second barrier metal layer and a second metal layer, the second barrier metal layer comprising titanium, titanium-nitride, tungsten-nitride, tantalum, or tantalum-nitride, the second metal layer comprising tungsten, aluminum, or copper.

20. The method as set forth in claim 17, wherein the cell transistors and the interconnections comprise a cell array architecture of a NAND flash memory.

* * * * *